United States Patent
Maheswari

(10) Patent No.: US 12,272,188 B2
(45) Date of Patent: Apr. 8, 2025

(54) DETERMINING A COVERAGE OF AUTONOMOUS VEHICLE SIMULATION TESTS

(71) Applicant: GM Cruise Holdings LLC, San Francisco, CA (US)

(72) Inventor: Priti Maheswari, Fremont, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 408 days.

(21) Appl. No.: 17/939,858

(22) Filed: Sep. 7, 2022

(65) Prior Publication Data

US 2024/0078852 A1  Mar. 7, 2024

(51) Int. Cl.
*G07C 5/08* (2006.01)
*G05D 1/00* (2006.01)

(52) U.S. Cl.
CPC ......... *G07C 5/0808* (2013.01); *G05D 1/0088* (2013.01)

(58) Field of Classification Search
CPC . G07C 5/0808; G05D 1/0088; G06F 11/3684; G06F 30/20; G06V 10/96; G06V 20/56
See application file for complete search history.

(56) References Cited

U.S. PATENT DOCUMENTS

| | | | |
|---|---|---|---|
| 11,112,797 B2 * | 9/2021 | Bin-Nun | B60W 50/045 |
| 2022/0348223 A1 * | 11/2022 | Zhao | B60W 40/02 |
| 2024/0060788 A1 * | 2/2024 | D'Avanzo | G01C 21/3476 |
| 2024/0169126 A1 * | 5/2024 | Zafeiropoulos | B60W 40/06 |

* cited by examiner

*Primary Examiner* — Sizo B Vilakazi

(57) ABSTRACT

Systems and techniques are provided for expanding a scope of coverage of test scenarios for training an autonomous vehicle (AV). An example method can include identifying a maneuver of an AV; receiving, from a test repository, a plurality of tests that includes the maneuver; identifying one or more segments on a map of an operational design domain (ODD) that include a driving environment for the maneuver; determining a similarity between a driving scene of each of the plurality of tests and the one or more segments on the map of the ODD; and determining a degree of test coverage for each of the one or more segments for the maneuver based on the determined similarity.

20 Claims, 6 Drawing Sheets

DETERMINING A COVERAGE OF AUTONOMOUS VEHICLE SIMULATION TESTS

TECHNICAL FIELD

The present disclosure generally relates to autonomous vehicles. For example, aspects of the present disclosure relate to systems and techniques for determining a coverage of autonomous vehicle simulation tests based on an operational design domain (ODD) coverage.

BACKGROUND

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system. Typically, the sensors are mounted at specific locations on the autonomous vehicles.

BRIEF DESCRIPTION OF THE DRAWINGS

Illustrative aspects and examples of the present application are described in detail below with reference to the following figures.

DETAILED DESCRIPTION

Figure 1:
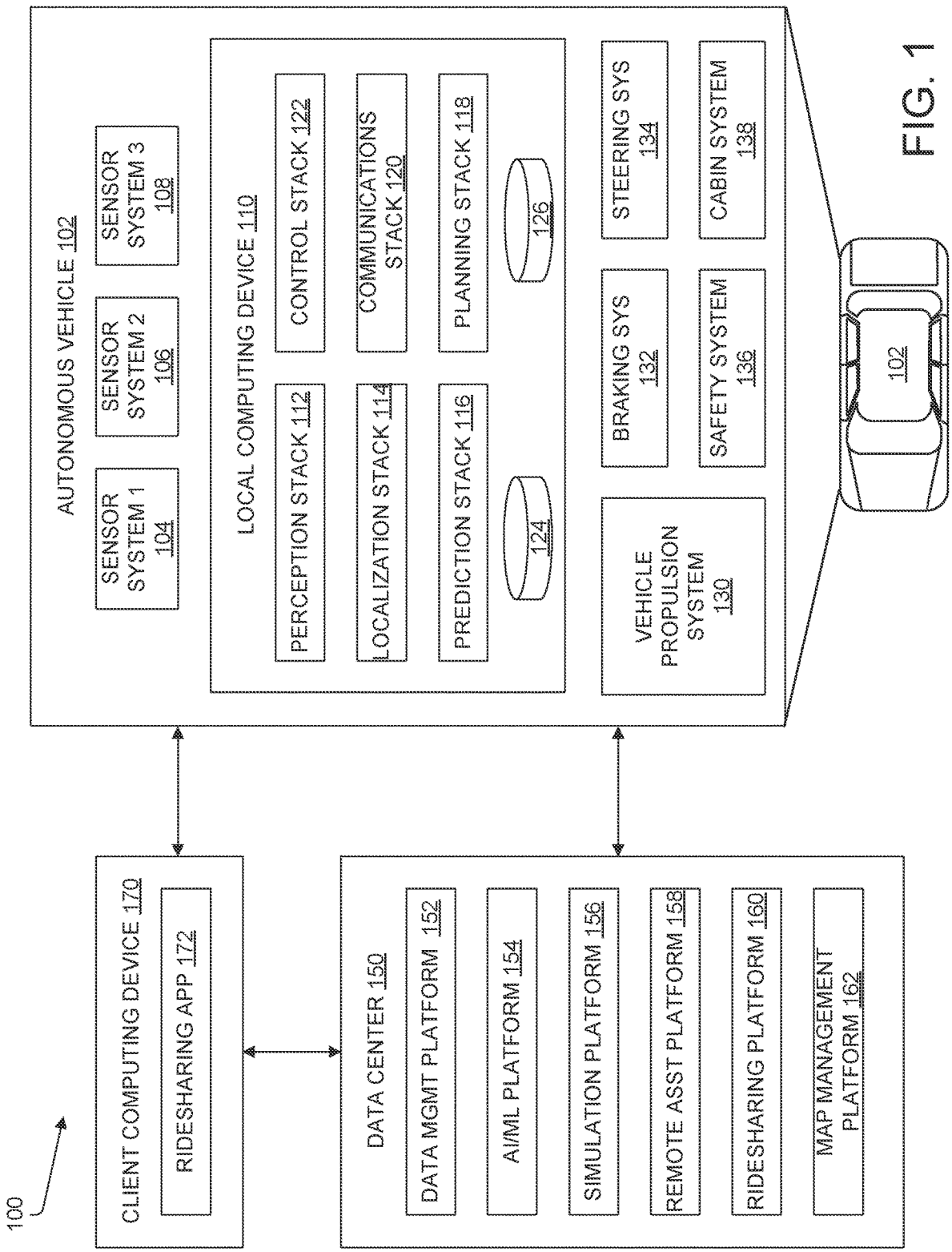
FIG. 1 is a diagram illustrating an example system environment that can be used to facilitate autonomous vehicle navigation and routing operations, in accordance with some examples of the present disclosure.

Certain aspects and examples of this disclosure are provided below. Some of these aspects and examples may be applied independently and some of them may be applied in combination as would be apparent to those of skill in the art. In the following description, for the purposes of explanation, specific details are set forth in order to provide a thorough understanding of aspects and examples of the application. However, it will be apparent that various aspects and examples of the disclosure may be practiced without these specific details. The figures and description are not intended to be restrictive.

The ensuing description provides examples and is not intended to limit the scope, applicability, or configuration of the disclosure. Rather, the ensuing description of aspects and examples of the disclosure will provide those skilled in the art with an enabling description for implementing an example implementation of the disclosure. It should be understood that various changes may be made in the function and arrangement of elements without departing from the scope of the application as set forth in the appended claims.

One aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

As previously explained, autonomous vehicles (AVs) can include various sensors, such as a camera sensor, a light detection and ranging (LIDAR) sensor, a radio detection and ranging (RADAR) sensor, amongst others, which the AVs can use to collect data and measurements that the AVs can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system.

AVs can be trained to operate in real driving environments to optimize the operation of the AVs, ensure that AVs are capable of performing certain maneuvers, and safely navigate real driving environments. However, given the large number of scenes and scene characteristics that an AV can potentially encounter in a real driving scenario, it is very expensive, time-consuming, and even unscalable or impossible (or nearly impossible) to train an AV for every possible driving scene and/or every scene feature (e.g., every scene attribute/characteristic, condition, scenario, etc.) that the AV may encounter. Accordingly, in some cases, simulated tests can be developed and used to train an AV to safely and adequately perform certain maneuvers and navigate different driving environments. The simulated tests can create a variety of AV maneuvers and/or simulated environments, conditions, and/or scene features that can be used to train the AV to safely and accurately perform the AV maneuvers and operate in driving scenes having a certain similarity (e.g., having a match or a threshold similarity) to the simulated environments, containing the simulated conditions and/or scene features, and/or containing other conditions and/or scene features having a threshold similarity to the simulated conditions and/or scene features.

The simulated tests can allow a developer to expand the amount and/or type of AV maneuvers and/or driving environments, conditions, and/or scene features, available to train an AV and ensure that the AV is trained to safely handle (e.g., operate and/or navigate) such AV maneuvers, driving environments, conditions, and/or scene features. Moreover, the simulated tests can allow a developer to significantly reduce the cost, time, and resources used to train an AV for different scenarios and/or maneuvers. The simulated tests can also allow a developer to train an AV for a significantly greater amount of driving environments, conditions, scenarios, maneuvers, and/or scene features than the developer otherwise could (or feasibly/scalably could) using real driving scenarios. For example, it is faster, cheaper, more scalable, and more feasible to use simulated tests to train an AV for a large number of different driving environments and conditions than training the AV for the same number of driving environments and conditions by driving the AV in real environments and conditions that match (or are similar to) all of the different driving environments and conditions covered in the simulated tests.

Indeed, it is likely impossible or nearly impossible to train an AV for every possible driving scenario (e.g., scenes, conditions, scene features, etc.) using only real driving metrics. For example, it is likely impossible or nearly impossible to train an AV for every possible driving scenario by driving the AV in enough real environments to cover every possible driving scenario (e.g., to obtain real driving metrics/data for every possible driving scenario) in order to train the AV for every possible driving scenario. To illustrate, it would be impossible or nearly impossible to search and find enough and sufficiently similar real environments to cover every possible driving scenario (e.g., every possible driving scene, condition, scene feature, etc.). Even if a developer could find enough and sufficiently similar real environments to cover every possible driving scenario, it would be very expensive, time consuming, unscalable, and difficult to drive the AV and collect driving metrics/data in enough and sufficiently similar real environments to train the AV and expand the training coverage to include every possible driving scenario.

As illustrated above, it is generally faster, cheaper, more scalable, and more feasible to use simulated tests to train an AV for a variety of driving scenarios than training the AV entirely based on metrics/data collected by the AV when driving in real environments. In some cases, to expand a scope of coverage of AV tests, a developer can additionally or alternatively reuse existing AV test scenarios with modifications made to cover variations of the AV test scenarios. Non-limiting examples of variations of test scenarios can include variations in the driving environments (e.g., variations in scene features, scene geometries, road attributes, environmental attributes/characteristics, geographic characteristics, etc.) associated with the AV test scenarios, variations in the driving conditions (e.g., weather conditions, driving parameters, driving restrictions, traffic requirements, performance parameters, operational attributes, etc.) in the driving environments, variations in the AV maneuvers tested/trained in the driving environments, variations in use cases (e.g., contextual variations, variations in operations/maneuvers, variations in test parameters, etc.), and/or any other variations.

For example, a developer can modify an existing AV test scenario by adding things to and/or removing things from (e.g., objects, humans, animals, vehicles, obstructions, trees/plants, buildings, traffic signs, intersections, stop locations, etc.) the scene of the AV test scenario, modifying one or more attributes of the scene (e.g., lane geometries, road types, an azimuth and/or elevation angle of a road in the scene, traffic, existence of shoulder and/or bicycle lanes, an existence of crossing lanes, scene visibility and/or illumination, etc.), modifying driving restrictions (e.g., changing a speed limit, prohibiting or allowing u-turns, prohibiting or allowing right turns when a traffic light is red, changing lane change rules, changing passing rules, etc.), modifying driving parameters (e.g., acceleration and/or deceleration parameters, left turn parameters, right turn parameters, stopping parameters, lane change parameters, passing parameters, speed parameters, parameters associated with defensive and/or aggressive driving, parameters defining a distance between the AV and any trailing or leading vehicles, braking parameters, light signal parameters, etc.), modifying weather conditions, and/or implementing any other variations.

To illustrate, assume an existing AV test scenario includes a one-way road and a four-way stop used to train one or more AV maneuvers when encountering intersections or stop signs. In this example, if a developer wants to train an AV in a similar driving environment but wants to train the AV to drive in a road having a different geometry and incline angle as the road in the test scenario as well as training the AV to handle obstructions at an intersection that affect a visibility of traffic arriving at the intersection from a different direction than the AV, rather than creating a new test scenario (e.g., by generating a test scenario with synthetic scene elements to emulate the desired environment and conditions, or by finding a real scene that emulates the desired environment and conditions and driving the AV in the real scene) to cover the desired environment and conditions (e.g., a one-way road with the different road geometry and incline angle, a four-way stop with an obstruction at the intersection), the developer can modify the geometry and incline angle of the road in the AV test scenario and add an obstruction at the four-way intersection, and use the modified AV test scenario to train the AV to perform one or more maneuvers in the desired environment and conditions. This way, the developer can reuse an existing AV test scenario to efficiently generate a new AV test scenario with any desired modifications.

As illustrated above, creating test scenarios to train an AV to perform a number of maneuvers within a driving environment of the test scenarios can be a difficult and often costly and time-consuming process. Indeed, it can be very difficult to train an AV to perform a number of expected and/or allowed maneuvers in scenarios with a variety of attributes to cover the various potential scenarios that the AV may encounter.

Described herein are systems, apparatuses, processes (also referred to as methods), and computer-readable media (collectively referred to as "systems and techniques") for increasing the test coverage of training scenarios used to train AVs. In some aspects, the systems and techniques described herein can determine a coverage of AV test scenarios based on an operational design domain (ODD) associated with the AVs and expanding the coverage of the AV test scenarios used to train the AVs.

In some cases, a developer can use an ODD to define where an AV can safely operate. An ODD can define any conditions, use cases, restrictions, scene attributes, and/or scenarios that the AV might encounter. In some aspects, the systems and techniques described herein can define a test coverage for an AV based on an ODD coverage. In some examples, the systems and techniques described herein can identify a road segment in an ODD of an AV, and expand the coverage of test scenarios to cover driving environments with one or more modifications to the road segment, such as changes to a geometry of one or more roads or lanes in the road segment, a condition in the road segment (e.g., an obstruction, different traffic conditions, a different visibility, different objects in an area(s) associated with the road segment, different traffic restrictions, different traffic signals (e.g., a stop sign instead of a traffic light or vice versa, etc.), different road attributes (e.g., types of roads, lane or road markings, number of lanes in the road, etc.)), different weather conditions, different environmental conditions (e.g., lightning, congestion, surrounding buildings or objects, etc.), different number of roads, different activity, different traffic rules, and/or any other modifications.

The systems and techniques described herein can use the driving scenarios with the expanded coverage to test/train one or more behaviors and/or maneuvers of an AV in the modified road segment, test/train one or more driving parameters of the AV driving in the modified road segment, and/or test/train any other aspects of the AV in the test scenarios with the expanded coverage. In some examples, the systems and techniques described herein can be used to identify any missing test coverage on road segments for a given ODD, expand the test scenarios available to include the missing test coverage, and train the AV using the expanded test scenarios including the missing test coverage.

For example, if a developer wants to train an AV to perform an unprotected left (UPL) turn in a variety of possible road geometries, the developer can determine what road geometries for UPL turns are missing from a given ODD associated with the AV. The developer can then create test scenarios to train the AV to perform the UPL turn in any missing road geometries, to ensure that the AV can handle UPL turns in roads with any geometries on any given ODD. For example, the developer can identify one or more road segments in the ODD that allow the AV to perform an UPL turn. The developer can determine that the ODD does not have coverage for UPL turns in similar road segments (e.g., similar to the one or more road segments in the ODD) having one or more different attributes such as different road geometries, different incline and/or azimuth angles, different road types, different number of lanes, different types of intersections, etc., and/or any other attributes. The developer can use the one or more road segments in the ODD to create additional test scenarios with the one or more road segments modified to have the one or more different attributes, and use the additional test scenarios to train the AV and increase the training coverage to include UPL turns in road segments having the one or more different attributes.

As illustrated above, the systems and techniques described herein can expand the coverage of test scenarios to include any missing coverage in an ODD. For example, the systems and techniques described herein can determine a coverage of a given ODD and use the determined coverage to identify any missing coverage. The missing coverage can include, for example and without limitations, one or more driving environments and/or conditions (e.g., one or more types of environments, road geometries, obstructions in road segment, road attributes, etc.), driving parameters (e.g., speed, braking parameters, acceleration/deceleration parameters, turning parameters, stopping parameters, signaling parameters, etc.), traffic rules (e.g., speed limit, turning rules, u-turn rules, stopping rules, etc.), AV behaviors and/or maneuvers, weather conditions, and/or any other conditions, features, and/or operations.

Examples of the systems and techniques described herein are illustrated in FIG. 1 through FIG. 6 and described below.

FIG. 1 is a diagram illustrating an example autonomous vehicle (AV) environment 100, according to some examples of the present disclosure. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skill the art will appreciate that such variations do not depart from the scope of the present disclosure.

In this example, the AV management system 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by sensor systems 104, 106, and 108. The sensor systems 104-108 can include one or more types of sensors and can be arranged about the AV 102. For instance, the sensor systems 104-108 can include Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other examples may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some examples, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can include a local computing device 110 that is in communication with the sensor systems 104-108, the mechanical systems 130-138, the data center 150, and/or the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a prediction stack 116, a planning stack 118, a communications stack 120, a control stack 122, an AV operational database 124, and an HD geospatial database 126, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 126, other components of the AV, and/or other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can identify environmental uncertainties, such as where to look for moving objects, flag areas that may be obscured or blocked from view, and so forth. In some examples, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.).

The mapping and localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some cases, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources.

The prediction stack 116 can receive information from the localization stack 114 and objects identified by the perception stack 112 and predict a future path for the objects. In some examples, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

The planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

The control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

The communications stack 120 can transmit and receive signals between the various stacks and other components of the AV 102 and between the AV 102, the data center 150, the client computing device 170, and other remote systems. The communications stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communications stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 126 can store HD maps and related data of the streets upon which the AV 102 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

The AV operational database 124 can store raw AV data generated by the sensor systems 104-108, stacks 112-122, and other components of the AV 102 and/or data received by the AV 102 from remote systems (e.g., the data center 150, the client computing device 170, etc.). In some examples, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

The data center 150 can include a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and/or any other network. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, and a ridesharing platform 160, and a map management platform 162, among other systems.

The data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structures (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), and/or data having other characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, the map management platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, the map management platform 162, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from the map management platform 162 and/or a cartography platform; modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system such as, for example and without limitation, a server, desktop computer, laptop computer, tablet computer, smartphone, smart wearable device (e.g., smartwatch, smart eyeglasses or other Head-Mounted Display (HMD), smart ear pods, or other smart in-ear, on-ear, or over-ear device, etc.), gaming system, or any other computing device for accessing the ridesharing application 172. In some cases, the client computing device 170 can be a customer's mobile computing device or a computing device integrated with the AV 102 (e.g., the local computing device 110). The ridesharing platform 160 can receive requests to pick up or drop off from the ridesharing application 172 and dispatch the AV 102 for the trip.

Map management platform 162 can provide a set of tools for the manipulation and management of geographic and spatial (geospatial) and related attribute data. The data management platform 152 can receive LIDAR point cloud data, image data (e.g., still image, video, etc.), RADAR data, GPS data, and other sensor data (e.g., raw data) from one or more AVs 102, Unmanned Aerial Vehicles (UAVs), satellites, third-party mapping services, and other sources of geospatially referenced data. The raw data can be processed, and map management platform 162 can render base representations (e.g., tiles (2D), bounding volumes (3D), etc.) of the AV geospatial data to enable users to view, query, label, edit, and otherwise interact with the data. Map management platform 162 can manage workflows and tasks for operating on the AV geospatial data. Map management platform 162 can control access to the AV geospatial data, including granting or limiting access to the AV geospatial data based on user-based, role-based, group-based, task-based, and other attribute-based access control mechanisms. Map management platform 162 can provide version control for the AV geospatial data, such as to track specific changes that (human or machine) map editors have made to the data and to revert changes when necessary. Map management platform 162 can administer release management of the AV geospatial data, including distributing suitable iterations of the data to different users, computing devices, AVs, and other consumers of HD maps. Map management platform 162 can provide analytics regarding the AV geospatial data and related data, such as to generate insights relating to the throughput and quality of mapping tasks.

In some examples, the map viewing services of map management platform 162 can be modularized and deployed as part of one or more of the platforms and systems of the data center 150. For example, the AI/ML platform 154 may incorporate the map viewing services for visualizing the effectiveness of various object detection or object classification models, the simulation platform 156 may incorporate the map viewing services for recreating and visualizing certain driving scenarios, the remote assistance platform 158 may incorporate the map viewing services for replaying traffic incidents to facilitate and coordinate aid, the ridesharing platform 160 may incorporate the map viewing services into the client application 172 to enable passengers to view the AV 102 in transit to a pick-up or drop-off location, and so on.

While the AV 102, the local computing device 110, and the autonomous vehicle environment 100 are shown to include certain systems and components, one of ordinary skill will appreciate that the AV 102, the local computing device 110, and/or the autonomous vehicle environment 100 can include more or fewer systems and/or components than those shown in FIG. 1. For example, the AV 102 can include other services than those shown in FIG. 1 and the local computing device 110 can also include, in some instances, one or more memory devices (e.g., RAM, ROM, cache, and/or the like), one or more network interfaces (e.g., wired and/or wireless communications interfaces and the like), and/or other hardware or processing devices that are not shown in FIG. 1. An illustrative example of a computing device and hardware components that can be implemented with the local computing device 110 is described below with respect to FIG. 6.

Figure 2:
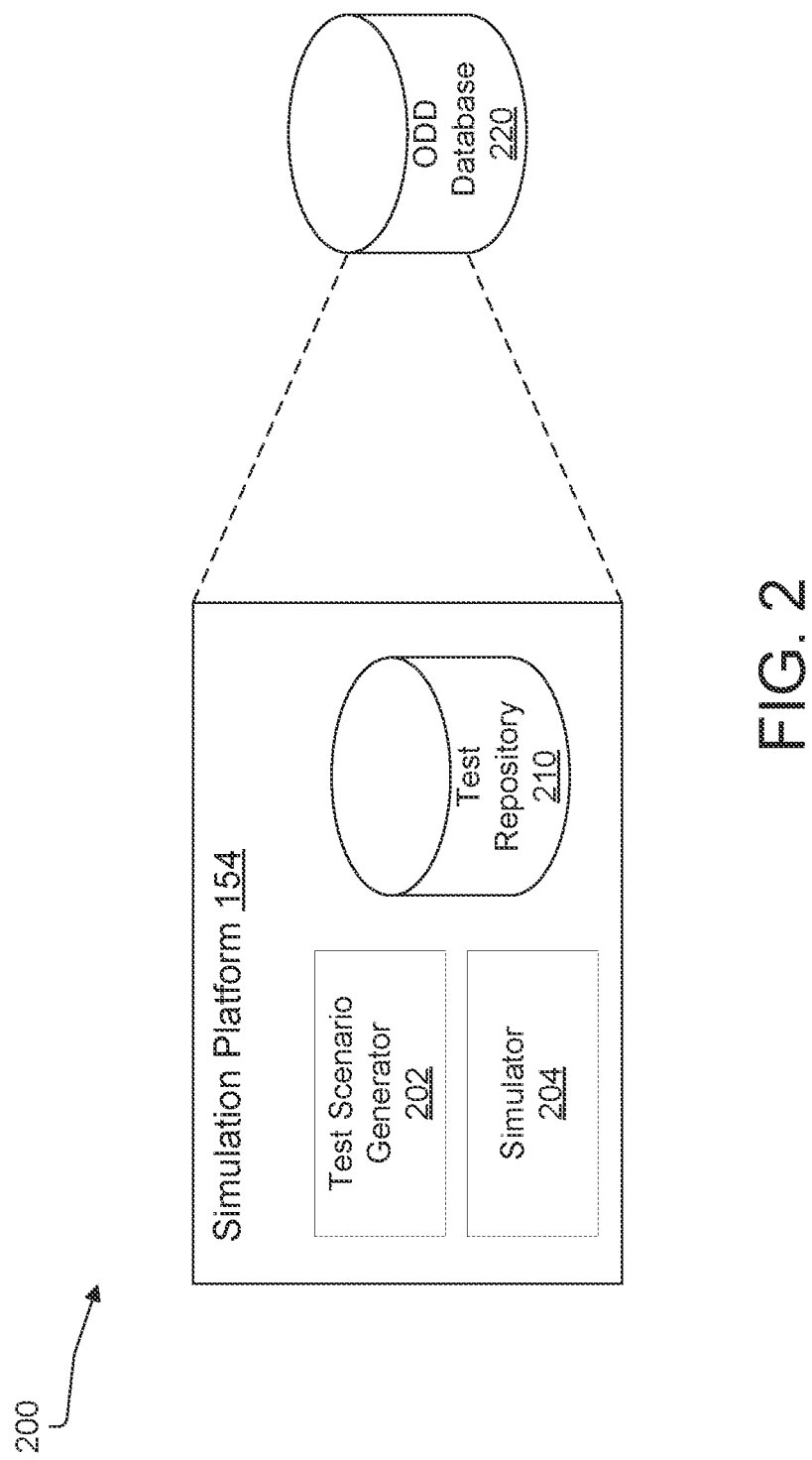
FIG. 2 is a diagram illustrating an example of a simulation platform in communication with an operational design domain database, in accordance with some examples of the present disclosure.

FIG. 2 is a diagram illustrating an example system 200 of expanding the coverage of test scenarios of a simulation platform 156 using ODD data from an ODD database 220. In the illustrative example shown in FIG. 2, the simulation platform 156 (similar to simulation platform 156 as illustrated in FIG. 1) can include a test scenario generator 202, a simulator 204, and a test repository 210. In some cases, the simulation platform 156 can communicate with an ODD database 220 to receive data stored in the ODD database 220 to determine the test coverage based on an ODD coverage as discussed in detail below.

As described with respect to FIG. 1, the simulation platform 156 enables AV testing via simulation. More specifically, the test scenario generator 202 can generate virtual test scenarios for an AV to practice in simulation. The test scenario generator 202 can create a test scenario based on AV driving data collected by an AV while navigating on road in the real world so that the test scenario replicates the real-world environment in simulation. Also, the test scenario generator 202 can utilize synthetic data (e.g., data collected via simulation), manual scripts, any applicable information and data available to the test scenario generator 202, or any combination of different types of data.

The test repository 210 stores a variety of test scenarios that are generated by the test scenario generator 202. Each test scenario comprises a map or road segment(s) in varying conditions that is designed to test various types of AV maneuvers and/or behaviors. An example of an AV maneuver for testing can include, without limitations, a right turn, a left turn, a U-turn, a two-point turn, a three-point turn, entering traffic, leaving traffic, a lane change, slowing down, coming out of a parking lot, leaving the road, an emergency stop, forward parking, reverse parking, parallel parking, bay parking (left or right), merging, passing another vehicle, etc.

The test repository 210 can include a plurality of test scenarios relating to a maneuver for testing with varying driving and/or environmental conditions such as road conditions, weather conditions, traffic conditions, road geometries, driving parameters, operational attributes, scene features, etc. For example, test scenario A can include a road segment for testing a left turn on a sunny day while test scenario B can include a road segment for testing a left turn on a rainy day. In another example, test scenario C can include a road segment for testing a lane change in a rural area while test scenario D can include a road segment for testing a lane change on a freeway with heavy traffic. A large volume of test scenarios stored in the test repository 210 is to cover every possible driving scenario that an AV may encounter in the real-world so that a sufficient number of testing can prepare an AV in simulation for a safe operation in the real-world. The test repository 210 stores a large volume of various test scenarios that define and cover the exhaustive list of possible driving environments and conditions an AV might encounter in the real-world for testing in simulation.

The simulator 204 can access the test repository 210 and replay a test scenario of interest for an AV to drive in simulation and validate the safety of an AV operation and navigation in a given driving environment and condition.

The ODD database 220 stores information associated with an ODD. An ODD includes all conceivable conditions, use cases, restrictions, and scenarios that an AV (e.g., AV 102 as illustrated in FIG. 1) might encounter within a given ODD. In other words, an ODD defines an operating condition such as a driving environment under which a given automated driving system (ADS) (e.g., AV 102 as illustrated in FIG. 1) is designed to safely operate in.

In some cases, an ODD can broadly include three high-level attributes: scenery (non-movable elements of the operating environment), environmental conditions, and dynamic conditions. The ODD database 220 can include those attributes for any given/defined ODD. Examples of the scenery can include, without limitations, road structures, roadway characteristics, zones (e.g., construction zone, residential zone, industrial zone), drivable areas, junctions, and/or special structures (e.g., buildings, bridges), and/or other static objects (e.g., trees, poles). Examples of the environmental conditions can include but are not limited to, weather conditions (e.g., fog, rain, snow, ice, wind, precipitation), particulates, time of day restrictions, lighting conditions (e.g., illumination), and/or other atmospheric conditions. Examples of the dynamic elements can include, without limitations, traffic conditions, movable objects and actors, and various dynamic objects such as vehicles, pedestrians, and/or animals in the operating environment. The ODD database 220 stores various ODD data including the above-referenced attributes/characteristics.

As previously noted, it is critical to validate that every road segment in a given ODD area (i.e., an area defined/covered by an ODD) that an AV can safely operate. Also, it is important to make sure that an AV is tested for a specific maneuver or behavior in every possible driving environment and condition (e.g., a driving environment as identified by an ODD). The system 200 can generate a simulation test scenario for testing an AV maneuver and/or behavior based on test scenarios from the test repository 210 and ODD data from the ODD database 220 and therefore, the system 200 can enrich the simulation database with newly created test scenarios and expand the test coverage.

In some cases, the system 200 can identify an AV maneuver or behavior of interest (e.g., an AV maneuver to be tested). The system 200 can receive a plurality of test scenarios that includes the maneuver from the test repository 210. For example, if a left-turn needs to be tested, any test scenario that includes a driving scene or a road segment that involves a left-turn can be provided to the system 200.

In some examples, the system 200 can identify, on a given ODD map, one or more road segments that involve the maneuver of interest (e.g., the maneuver identified by the system 200 for testing). The system 200 can validate whether each of the road segments is sufficiently covered and validated by test scenario(s) stored in the test repository 210. More specifically, the system 200 can compare the plurality of test scenarios that includes the maneuver and compare with the road segments identified on the given ODD map.

When comparing between the test scenarios and the road segments identified on the ODD map, the system 200 can determine a similarity between a driving scene of each of the test scenarios and the road segments on the ODD map to determine if the road segments on the ODD map are covered by the test scenarios that are stored in the test repository 210 for the maneuver of interest (e.g., an AV maneuver to be tested). As described above, the ODD database 220 includes ODD data that include various types of attributes relating to a driving environment, for example, scenery (e.g., road conditions and/or characteristics), environmental conditions, and dynamic conditions. As follows, a driving scene of a test scenario and a road segment on an ODD map can be compared using the ODD data to determine a similarity between them (e.g., based on the ODD attributes as described above).

In some examples, a similarity between the driving scene of each of the test scenarios and the road segments on the ODD map can be determined based on various factors such as features and/or characteristics of a driving scene that involves a maneuver of interest. For example, road characteristics such as a geometry of the road can be compared. A number of lanes, a width of a lane, presence of a curve, an angle of a curve, presence of an intersection, or elevation of a road (e.g., uphill, downhill, flat, etc.) can be compared to determine the similarity. Other examples of road characteristics that can be considered include, without limitations, an azimuth of a curve, a type of road (e.g., gravel, concrete, dirt, brick, etc.), speed limit, presence of bicycle lanes, and/or presence of a pedestrian crosswalk.

In addition to road characteristics, environmental conditions or characteristics can be considered in determining a similarity between a driving scene of a test scenario and a road segment on an ODD map. Examples of the environmental/scene conditions or characteristics can include, without limitations, time of a day, weather conditions (e.g., rain, snow, fog, precipitation, wind, humidity, etc.), traffic conditions, a type of traffic (e.g., pedestrians, commercial vehicles, trucks, motorcycles, bicycles), lighting conditions (e.g., shadows from buildings, bright areas from natural and/or artificial light), permitted or prohibited maneuvers (e.g., a U-turn, a right turn on red, etc.), relative distance between an AV and objects in the scene, and/or relative distance between objects in the scene.

In some examples, each of the variety of factors can be compared one-to-one to determine the similarity. Further, an overall scene can be compared to determine the similarity, for example, based on a certain percentage or an amount of overlap, match, or a certain number or percentage of matching features/factors. For example, if a number of matching factors or a percentage of matching factors between a driving scene from a test scenario and a road segment on an ODD map exceeds a threshold, the system 200 can determine that a maneuver on a road segment on an ODD map can be tested and validated with a test scenario that is determined to have a similar driving scene.

In some cases, a weighted function (e.g., a weighted sum) can be used to determine whether a road segment identified on an ODD map for a certain maneuver can be validated with a test scenario stored in the test repository 210. More specifically, each factor that contributes to determining a similarity can be given a weight and a similarity can be based on a weighted function (e.g., a weighted sum) of various weighted factors. For example, a width of a lane can be given more weight so that if a width of a lane in a driving scene from a test scenario and a road segment identified on an ODD map is the same or the difference is within a predetermined range, it contributes more to a weighted function in determining a similarity. When a weighted function (e.g., a weighted sum) exceeds a threshold, a driving scene from a test scenario and a road segment identified on an ODD map for a certain maneuver can be determined to be similar. As follows, the system 200 determines that a maneuver on a road segment identified on an ODD map can be tested and validated with a test scenario that is determined to a similar driving scene.

In some examples, a road segment identified on an ODD map for a certain maneuver can be compared against a driving scene of each and every test scenario that involves the maneuver to determine which test scenario includes a driving scene that is similar to a road segment on an ODD map. As follows, the system 200 can determine a degree of test coverage for a road segment identified on an ODD map based on the similarity that is determined as described above. In other words, a degree of test coverage can help determine whether the maneuver on an ODD map is sufficiently covered or tested by existing test scenarios. In some examples, the degree of test coverage can be based on a number of test scenarios that have the determined similarity exceeding a threshold. For example, if a number of test scenarios that include a driving scene that is similar to a road segment identified on an ODD for a certain maneuver is over 100, the degree of test coverage can be defined high (i.e., a maneuver on a road segment identified on an ODD map can be sufficiently tested and validated with existing test scenarios. If the number is between 51-100, the degree of test coverage can be defined medium. If the number is below 50, the degree of test coverage can be defined low and therefore, the system 200 can determine that more test scenarios need to be generated to validate the safety of a maneuver in a driving scene that is identical or similar to a road segment on an ODD map. In such case, test scenario generator 202 can create a test scenario that emulates the road segment on an ODD map that needs a test coverage so that an AV can be tested in the newly created test scenario to validate the safety of an AV maneuver. The test scenario generator 202 can utilize ODD data from the ODD database 220 (e.g., details of scene features and characteristics) to replicate a driving scene as appeared on an ODD map.

In some examples, if the system 200 determines that a new test scenario needs to be generated to provide test coverage for a maneuver on a road segment identified on an ODD map, the system 200 can utilize the already existing test scenario that can be obtained from the test repository 210. More specifically, the system 200 can receive a test scenario that involves a driving scene for a maneuver of interest (e.g., a test scenario that has the highest similarity to the road segment on the road segment on the ODD map). The system 200 can adjust and modify the existing test scenario to replicate the road segment as appeared on the ODD map. For example, the system 200 can add and/or remove scene features (e.g., dynamic or static elements such as humans, animals, vehicles, obstructions, trees/plants, buildings, traffic signs, intersections, stop locations, etc.), modify one or more scene attributes (e.g., lane geometries, road types, an azimuth and/or elevation angle of a road in the scene, traffic, existence of shoulder and/or bicycle lanes, an existence of crossing lanes, scene visibility and/or illumination, etc.), modify driving restrictions (e.g., changing a speed limit, prohibiting or allowing u-turns, prohibiting or allowing right turns when a traffic light is red, changing lane change rules, changing passing rules, etc.), modify driving parameters (e.g., acceleration and/or deceleration parameters, left turn parameters, right turn parameters, stopping parameters, lane change parameters, passing parameters, speed parameters, parameters associated with defensive and/or aggressive driving, parameters defining a distance between the AV and any trailing or leading vehicles, braking parameters, light signal parameters, etc.), modify weather conditions, and/or implement any other variations.

The components shown in FIG. 2 with respect to the simulation platform 156 in communication with the ODD database 220 are illustrative examples provided for explanation purposes. In other examples, the simulation platform 156 can include more or less components than those shown in FIG. 2. While the simulation platform 156 is shown to include certain components, one of ordinary skill will appreciate that the simulation platform 156 can include more or fewer components that those shown in FIG. 2.

Figure 3:
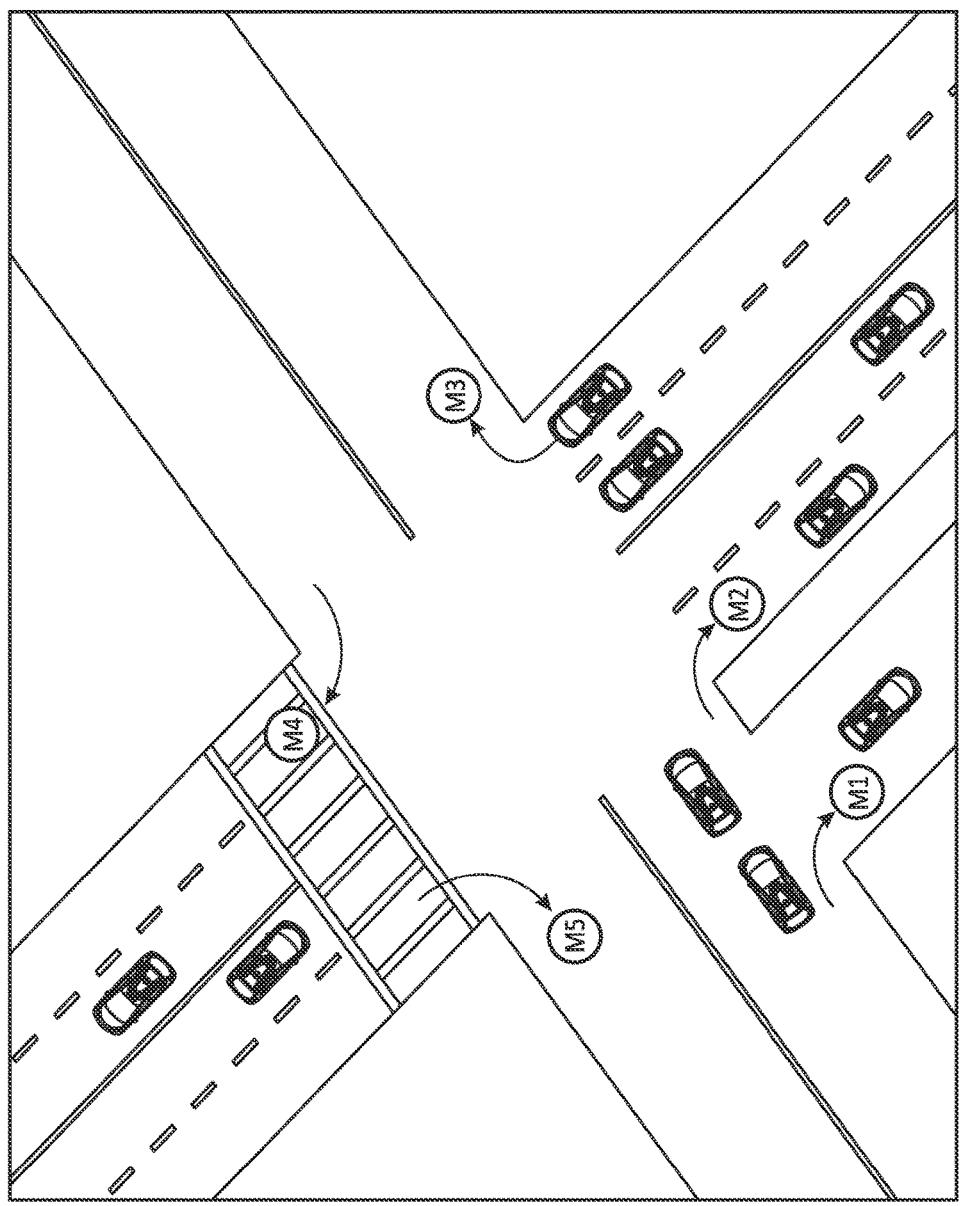
FIG. 3 is a diagram illustrating an example map of an operational design domain, in accordance with some examples of the present disclosure.

FIG. 3 is a diagram illustrating an example ODD map 300 that represents an area that is defined by an ODD. In other words, the ODD map 300 covers an area that comprises various conditions that an AV can operate safely, for example based on various ODD factors/attributes.

As shown in FIG. 3, the ODD map 300 consists of road segments that involve various types of maneuvers. To illustrate an example, the ODD map 300 includes five road segments that involve a right turn, M1-M5 as shown in FIG. 3. While M1 through M5 relate to the same maneuver (i.e., a right turn), each maneuver takes place in a different driving scene/environment and condition. For example, M1 involves a right turn onto a one-way street. M2 involves a right turn from a one-lane road to a two-lanes road. M3 involves a right turn from a two-lanes road to a one-lane road. M4 involves a right turn onto a road with a pedestrian crosswalk. M5 involves a right turn onto a one-lane road out of a pedestrian crosswalk. Therefore, the same test scenario that involves a right-turn driving scene may not be suitable (i.e., cannot be universally used) to provide sufficient validation of the safety for all M1-M5 maneuvers. For example, a test scenario in which an AV is simulated to make a right turn onto a one-way street without a pedestrian crosswalk may adequately cover a test for M1 on the ODD map 300. However, the same test scenario may not sufficiently validate the safety of a right turn into a two-lanes road with a pedestrian crosswalk (e.g., M4 on the ODD map 300).

In order to determine which one on the ODD map 300 is covered by existing test scenarios (e.g., test scenarios stored in the test repository 210 as illustrated in FIG. 2), a similarity between a driving scene for a right turn in an existing test scenario and a road segment involving M1 through M5 on an identified ODD map 300 can be determined as described with respect to FIG. 2.

Figure 4B:
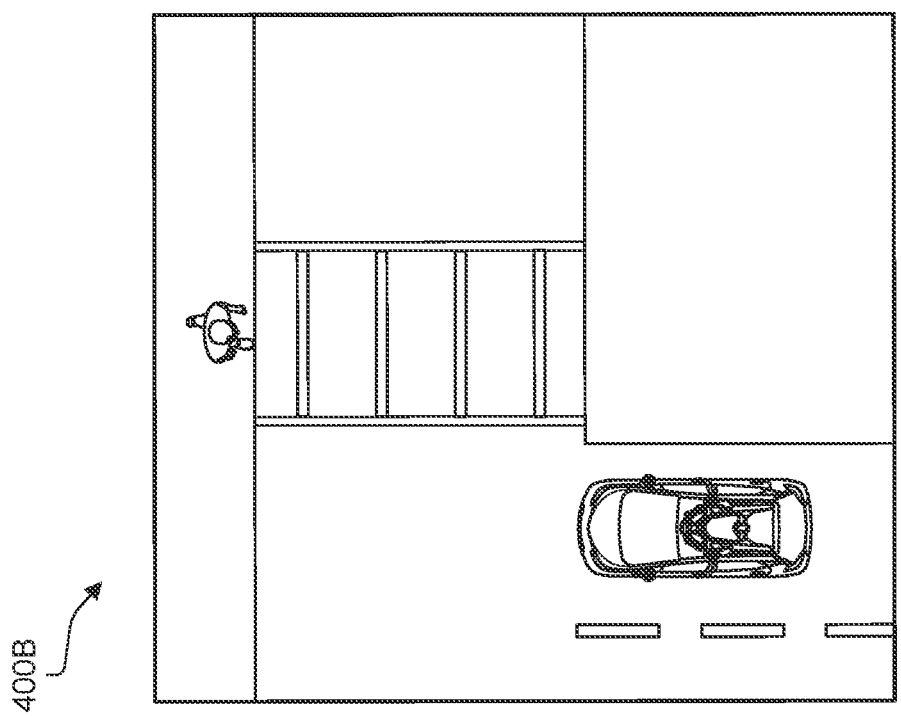
FIG. 4B is a diagram illustrating an example of a road segment from a simulation test scenario, in accordance with some examples of the present disclosure.
Figure 4A:
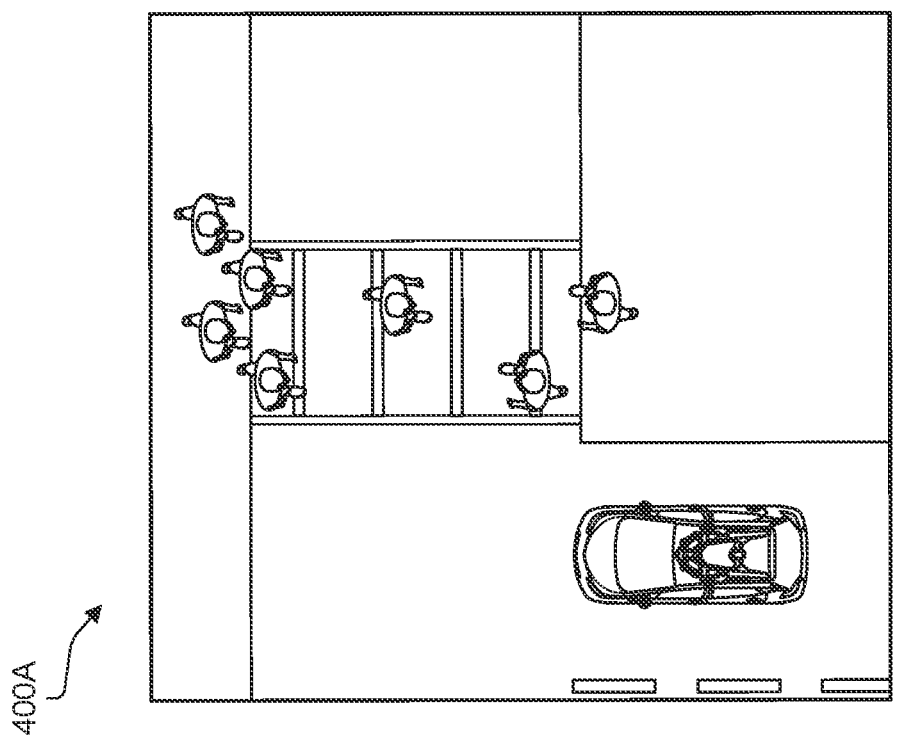
FIG. 4A is a diagram illustrating an example of a road segment from an operational design domain map, in accordance with some examples of the present disclosure.

FIG. 4A is a diagram illustrating an example of a road segment 400A from an ODD map. In this example, an AV (e.g., AV 102 as illustrated in FIG. 1) can be placed in the road segment 400A that involves a right turn onto a road that has a pedestrian crosswalk. As shown in FIG. 4A, seven pedestrians are crossing the pedestrian crosswalk.

FIG. 4B is a diagram illustrating an example of a driving scene 400B from a test scenario. As shown, an AV (e.g., AV 102 as illustrated in FIG. 1) can be placed in the driving scene 400B that involves a right turn onto a road that has a pedestrian crosswalk. There is one pedestrian who is about to cross the crosswalk towards where the AV is about to make a right turn into.

In order to determine that a right turn on the road segment 400A can be covered by the test scenario that includes the driving scene 400B, the system (similar to system 200 as illustrated in FIG. 2) can determine a similarity between the road segment 400A and the driving scene 400B based on various factors such as scene features and conditions, road characteristics, and/or environmental conditions. The information of these factors relating to the road segment 400A on the ODD map can be provided by an ODD database (e.g., the ODD database 220 as illustrated in FIG. 2) as these factors overlap with the ODD factors as described with respect to FIG. 2.

As shown in FIGS. 4A and 4B, the system can determine similarities and/or dissimilarities between the road segment 400A and the driving scene 400B. For example, a width of a lane in the road segment 400A is wider than a width of a lane in the driving scene 400B. The system can determine if the width difference is within a predetermined range. If the width difference is within the predetermined range, the system can determine that the width of a lane can be a factor that contributes to similarity. If the width difference is not within the predetermined range, the system can determine that the width of a lane is a factor that contributes to dissimilarity. In another example, the system can determine and compare the traffic conditions of the road segment 400A and the driving scene 400B. While seven pedestrians are crossing the crosswalk in the road segment 400A, one pedestrian is crossing the crosswalk in the driving scene 400B. If the difference in the number of pedestrians is within a predetermined range, the system can determine that the number of pedestrians can be a factor that contributes to similarity. On the other hand, if the difference is not within the predetermined range, the system can determine that the number of pedestrians is a factor that contributes to dissimilarity. Further, if a number of pedestrians on the crosswalk near the right turn corner is considered, the road segment 400A includes at least two pedestrians while the driving scene 400B does not include any pedestrians on the crosswalk near the right turn corner. If the difference in the number of pedestrians near a right-turn making vehicle is within the predetermined range, the system can determine that the number of pedestrians near a right-turn making vehicle can be a factor that contributes to similarity. If not, the system can determine that the number of pedestrians near a right-turn making vehicle is a factor that contributes to dissimilarity. In addition to the number of pedestrians near the right-turn making vehicle, the same can be determined similarly with respect to the number of pedestrians within a predetermined range of distance to the right-turn making vehicle.

Additionally, an angle of the curve (i.e., right-turn corner) can be compared to determine if the difference in the angle of the curve is within a predetermined range. Depending on whether the difference is within the predetermined range or not, the system can categorize the angle of the curve as a factor that contributes to similarity or dissimilarity, respectively. Also, road conditions can be also compared. For example, an elevation of the road on the road segment can be compared between FIG. 4A and FIG. 4B to determine if the difference is within a predetermine range or not and therefore whether the elevation of the road is a factor that contributes to similarity or dissimilarity, respectively.

Further, the system can determine a degree of the similarities and/or dissimilarities of the overall driving environments between the road segment 400A and the driving scene 400B. Based on a combination of various factors (e.g., a width of a lane, a number of pedestrians, etc.), the system can determine if a degree of similarity between the road segment 400A and the driving scene 400B exceeds a threshold and therefore an AV maneuver on the road segment 400A can be validated by testing the maneuver in the driving scene 400B. In some examples, the degree of similarity can be a number of factors that contribute to the similarity. In other examples, the degree of similarity can be a weighted function (e.g., a weighted sum) of the factors. Various methods can be utilized to determine the degree of similarity of the overall driving scenes in the road segment 400A on the ODD map and the driving scene 400B from the test scenario.

In some examples, if the system determines that a maneuver (e.g., a right turn) on the road segment 400A cannot be validated by the test scenario that includes the driving scene 400B, the system can determine that the maneuver on the road segment 400A does not have sufficient test coverage and generate a new test scenario to test the maneuver on the road segment 400A by replicating the driving environment of the road segment 400A. Instead of creating the new test scenario from scratch, the system (e.g., test scenario generator 202 as illustrated in FIG. 2) can utilize the already existing test scenario that includes the driving scene 400B. More specifically, the system can adjust the driving environment (e.g., adding and/or removing scene features) of the driving scene 400B to replicate the road segment 400A. For example, the system can make the width of the lane narrower and add more pedestrians on the crosswalk so that a driving environment that is identical to the road segment 400A can be created in the new test scenario. This way, time and cost for generating a test scenario can be reduced compared to manually creating the test scenario from scratch.

While FIGS. 4A and 4B are described as one example of one-to-one comparison between an ODD map and a test scenario to determine the test coverage, in other examples, a road segment for a certain maneuver on an ODD map can be compared against a plurality of test scenarios that include a driving scene for the maneuver. The system can determine the test coverage based on the total number of test scenarios that are similar to the road segment identified on the ODD map or an overall similarity (e.g., in a percentage, an amount, or a number) of the plurality of test scenarios. For example, if the total number of test scenarios that are similar to the road segment identified on the ODD map is below a threshold, the system can determine that a maneuver on the road segment needs test coverage and generate a new test scenario for coverage.

Figure 5:
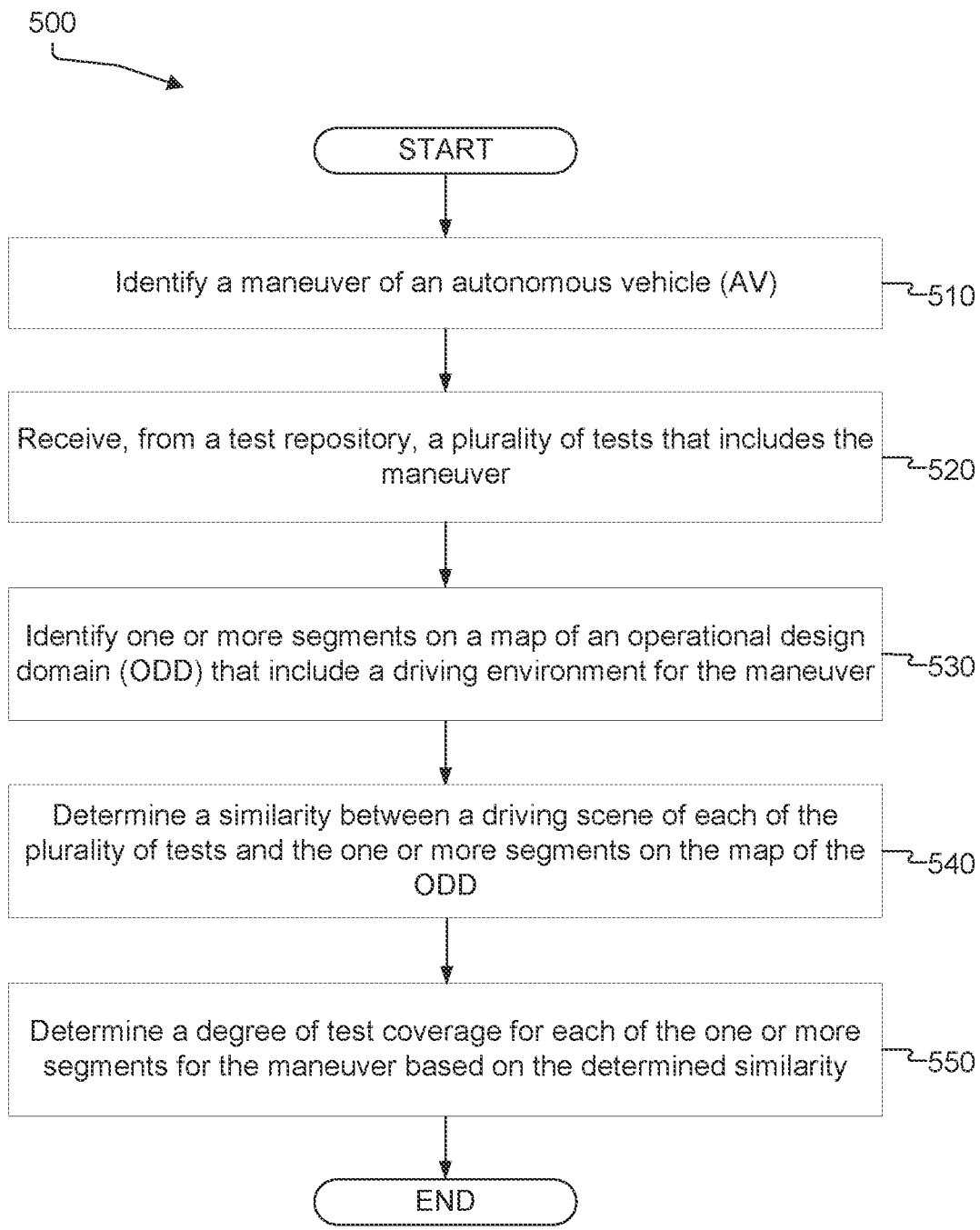
FIG. 5 is a flowchart illustrating an example process for expanding a coverage of autonomous vehicle test scenarios, in accordance with some examples of the present disclosure.

FIG. 5 is a flowchart illustrating an example process 500 for expanding a coverage of autonomous vehicle test scenarios. Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence.

At block 510, the process 500 can include identifying a maneuver of an AV. For example, the system 200 as illustrated in FIG. 2 can identify a maneuver of an AV (e.g., AV 102 as illustrated in FIG. 1) of interest.

At block 520, the process can include receiving, from a test repository, a plurality of tests that includes the maneuver. For example, the system 200 as illustrated in FIG. 2 can receive a plurality of test scenarios that includes the maneuver that is identified at block 510 from the test repository 210 as described in FIG. 2.

At block 530, the process 500 can include identifying one or more segments on a map of an operational design domain (ODD) that include a driving environment for the maneuver. For example, the system 200 as illustrated in FIG. 2 can identify one or more road segments on an ODD map that include a driving environment for the maneuver of interest.

At block 540, the process 500 can include determining a similarity between a driving scene of each of the plurality of tests and the one or more segments on the map of the ODD. For example, the system 200 as illustrated in FIG. 2 can determine a similarity between the driving scene of each of the plurality of test scenarios and the one or more road segments identified on the ODD map for the maneuver.

In some cases, determining the similarity can include comparing a first geometry of the driving scene of each of the plurality of tests with a second geometry of the one or more segments identified on the map of the ODD for the maneuver. For example, in comparing the geometry, road characteristics and conditions can be considered such as a width of a lane as shown in FIGS. 4A and 4B.

In some aspects, determining the similarity can be based on at least one of a road structure, an environmental condition, and a traffic condition. For example, the system 200 as illustrated in FIG. 2 can consider various factors and elements associated with a road structure, an environmental condition, a traffic condition, and/or any attributes relating to the driving environment. Some examples of those factors and elements can include, without limitations, time of a day, weather conditions (e.g., rain, snow, fog, precipitation, wind, humidity, etc.), traffic conditions, a type of traffic (e.g., pedestrians, commercial vehicles, trucks, motorcycles, bicycles), lighting conditions (e.g., shadows from buildings, bright areas from natural and/or artificial light), permitted or prohibited maneuvers (e.g., a U-turn, a right turn on red, etc.), relative distance between an AV and objects in the scene, and/or relative distance between objects in the scene.

At block 550, the process 500 can include determining a degree of test coverage for each of the one or more segments for the maneuver based on the determined similarity. For example, the system as illustrated in FIG. 2 can determine a degree of test coverage for each of the one or more road segments for the maneuver of interest based on the similarity that is determined at block 540.

In some aspects, the process 500 can include in response to determining that the degree of test coverage is below a threshold in a segment of the one or more segments on the map of the ODD, generating a test for the maneuver that emulates the segment on the map of the ODD. For example, the system 200 as illustrated in FIG. 2 can, if the degree of the test coverage is below a threshold, generate a test scenario for the maneuver that replicates the road segment identified on the ODD map.

In some cases, generating the test can include receiving the test that includes the maneuver from the test repository and adjusting one or more scene features in the test to emulate the segment on the map of the ODD for the maneuver. For example, the system 200 as illustrated in FIG. 2 can generate the test scenario by adjusting scene features (e.g., adding and/or removing, increasing or decreasing, stretching or reducing some elements in the driving environment) of the already existing test scenario to emulate the scene as appeared on the ODD map.

In some aspects, the one or more scene features include at least one of a road structure, an environmental condition, and a traffic condition. For example, the system 200 as illustrated in FIG. 2 can adjust road structures, environmental conditions, and/or traffic conditions.

In some cases, the degree of test coverage is determined based on a number of tests that have the determined similarity exceeding a predetermined level. For example, the system 200 as illustrated in FIG. 2 can determine the degree of test coverage based on a number of tests that have the determined similarity exceeding a predetermined threshold.

Figure 6:
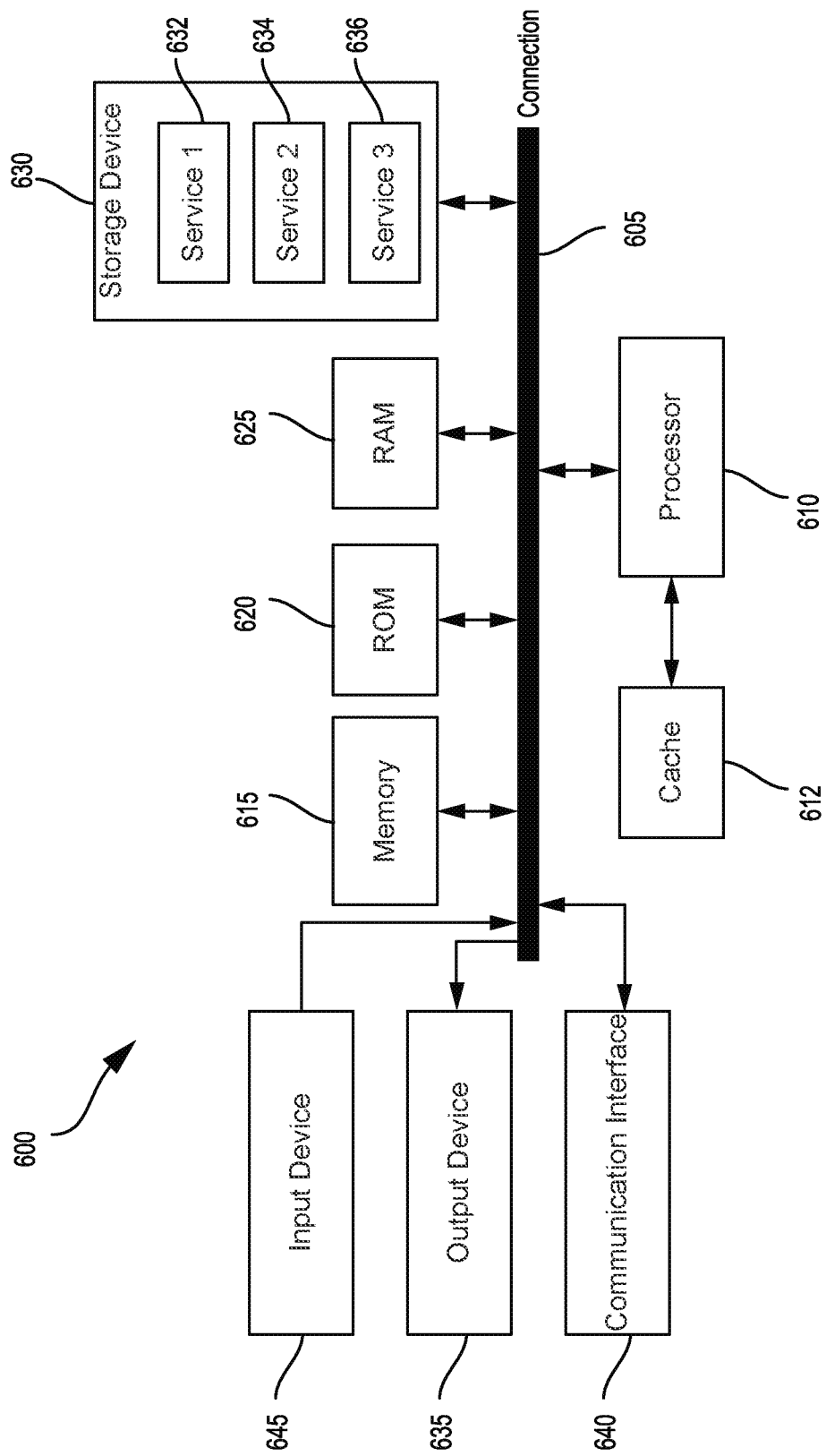
FIG. 6 is a diagram illustrating an example system architecture for implementing certain aspects described herein.

FIG. 6 illustrates an example processor-based system with which some aspects of the subject technology can be implemented. For example, processor-based system 600 can be any computing device making up local computing device 110, client computing device 170, a passenger device executing the ridesharing application 172, or any component thereof in which the components of the system are in communication with each other using connection 605. Connection 605 can be a physical connection via a bus, or a direct connection into processor 610, such as in a chipset architecture. Connection 605 can also be a virtual connection, networked connection, or logical connection.

In some examples, computing system 600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 600 includes at least one processing unit (CPU or processor) 610 and connection 605 that couples various system components including system memory 615, such as read-only memory (ROM) 620 and random-access memory (RAM) 625 to processor 610. Computing system 600 can include a cache of high-speed memory 612 connected directly with, in close proximity to, and/or integrated as part of processor 610.

Processor 610 can include any general-purpose processor and a hardware service or software service, such as services 632, 634, and 636 stored in storage device 630, configured to control processor 610 as well as a special-purpose processor where software instructions are incorporated into the actual processor design. Processor 610 may essentially be a completely self-contained computing system, containing multiple cores or processors, a bus, memory controller, cache, etc. A multi-core processor may be symmetric or asymmetric.

To enable user interaction, computing system 600 can include an input device 645, which can represent any number of input mechanisms, such as a microphone for speech, a touch-sensitive screen for gesture or graphical input, keyboard, mouse, motion input, speech, etc. Computing system 600 can also include output device 635, which can be one or more of a number of output mechanisms known to those of skill in the art. In some instances, multimodal systems can enable a user to provide multiple types of input/output to communicate with computing system 600. Computing system 600 can include communications interface 640, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/9G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communications interface 640 may also include one or more Global Navigation Satellite System (GNSS) receivers or transceivers that are used to determine a location of the computing system 600 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 630 can be a non-volatile and/or non-transitory computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD)

optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L9/L #), resistive random-access memory (RRAM/ReRAM), phase change memory (PCM), spin transfer torque RAM (STT-RAM), another memory chip or cartridge, and/or a combination thereof.

Storage device 630 can include software services, servers, services, etc., that when the code that defines such software is executed by the processor 610, causes the system to perform a function. In some examples, a hardware service that performs a particular function can include the software component stored in a computer-readable medium in connection with the necessary hardware components, such as processor 610, connection 605, output device 635, etc., to carry out the function.

As understood by those of skill in the art, machine-learning techniques can vary depending on the desired implementation. For example, machine-learning schemes can utilize one or more of the following, alone or in combination: hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning classification models can also be based on clustering algorithms (e.g., a Mini-batch K-means clustering algorithm), a recommendation algorithm (e.g., a Mini-wise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

Aspects within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special-purpose computer, or special-purpose processing device to perform a certain function or group of functions. By way of example, computer-executable instructions can be used to implement perception system functionality for determining when sensor cleaning operations are needed or should begin. Computer-executable instructions can also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other examples of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination thereof) through a communications network. In a distributed computing environment, program modules can be located in both local and remote memory storage devices.

The various examples described above are provided by way of illustration only and should not be construed to limit the scope of the disclosure. For example, the principles herein apply equally to optimization as well as general improvements. Various modifications and changes may be made to the principles described herein without following the example aspects and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative examples of the disclosure include:

Aspect 1. A system comprising: a memory; and one or more processors coupled to the memory, the one or more processors being configured to: identify a maneuver of an autonomous vehicle (AV); receive, from a test repository, a plurality of tests that includes the maneuver; identify one or more segments on a map of an operational design domain (ODD) that include a driving environment for the maneuver; determine a similarity between a driving scene of each of the plurality of tests and the one or more segments on the map of the ODD; and determine a degree of test coverage for each of the one or more segments for the maneuver based on the determined similarity.

Aspect 2. The system of Aspect 1, wherein determining the similarity comprises: comparing a first geometry of the driving scene of each of the plurality of tests with a second geometry of the one or more segments identified on the map of the ODD for the maneuver.

Aspect 3. The system of Aspect 1 or 2, wherein determining the similarity is based on at least one of a road structure, an environmental condition, and a traffic condition.

Aspect 4. The system of any of Aspects 1 to 3, wherein the one or more processors are configured to: in response to determining that the degree of test coverage is below a threshold in a segment of the one or more segments on the map of the ODD, generate a test for the maneuver that emulates the segment on the map of the ODD.

Aspect 5. The system of Aspect 4, wherein generating the test comprises: receiving the test that includes the maneuver from the test repository; and adjusting one or more scene features in the test to emulate the segment on the map of the ODD for the maneuver.

Aspect 6. The system of any of Aspects 1 to 5, wherein the one or more scene features include at least one of a road structure, an environmental condition, and a traffic condition.

Aspect 7. The system of Aspect 6, wherein the degree of test coverage is determined based on a number of tests that have the determined similarity exceeding a predetermined level.

Aspect 8. The system of any of Aspects 6 or 7, wherein the system comprises the autonomous vehicle.

Aspect 9. A method comprising: identifying a maneuver of an autonomous vehicle (AV); receiving, from a test repository, a plurality of tests that includes the maneuver; identifying one or more segments on a map of an operational design domain (ODD) that include a driving environment for the maneuver; determining a similarity between a driving scene of each of the plurality of tests and the one or more segments on the map of the ODD; and determining a degree of test coverage for each of the one or more segments for the maneuver based on the determined similarity.

Aspect 10. The method of Aspect 9, wherein determining the similarity comprises: comparing a first geometry of the driving scene of each of the plurality of tests with a second geometry of the one or more segments identified on the map of the ODD for the maneuver.

Aspect 11. The method of Aspect 9 or 10, wherein determining the similarity is based on at least one of a road structure, an environmental condition, and a traffic condition.

Aspect 12. The method of Aspect 9 to 11, further comprising: in response to determining that the degree of test coverage is below a threshold in a segment of the one or more segments on the map of the ODD, generate a test for the maneuver that emulates the segment on the map of the ODD.

Aspect 13. The method of Aspect 9 to 12, wherein generating the test comprises: receiving the test that includes the maneuver from the test repository; and adjusting one or more scene features in the test to emulate the segment on the map of the ODD for the maneuver.

Aspect 14. The method of Aspect 9 to 13, wherein the one or more scene features include at least one of a road structure, an environmental condition, and a traffic condition.

Aspect 15. The method of Aspect 9 to 14, wherein the degree of test coverage is determined based on a number of tests that have the determined similarity exceeding a predetermined level.

Aspect 16. A non-transitory computer-readable medium having stored thereon instructions which, when executed by one or more processors, cause the one or more processors to: identify a maneuver of an autonomous vehicle (AV); receive, from a test repository, a plurality of tests that includes the maneuver; identify one or more segments on a map of an operational design domain (ODD) that include a driving environment for the maneuver; determine a similarity between a driving scene of each of the plurality of tests and the one or more segments on the map of the ODD; and determine a degree of test coverage for each of the one or more segments for the maneuver based on the determined similarity.

Aspect 17. The non-transitory computer-readable medium of Aspect 16, wherein determining the similarity comprises: comparing a first geometry of the driving scene of each of the plurality of tests with a second geometry of the one or more segments identified on the map of the ODD for the maneuver.

Aspect 18. The non-transitory computer-readable medium of Aspect 16 or 17, wherein determining the similarity is based on at least one of a road structure, an environmental condition, and a traffic condition.

Aspect 19. The non-transitory computer-readable medium of Aspect 16 to 18, wherein the one or more processors are configured to: in response to determining that the degree of test coverage is below a threshold in a segment of the one or more segments on the map of the ODD, generate a test for the maneuver that emulates the segment on the map of the ODD.

Aspect 20. The non-transitory computer-readable medium of Aspect 16 to 19, wherein generating the test comprises: receiving the test that includes the maneuver from the test repository; and adjusting one or more scene features in the test to emulate the segment on the map of the ODD for the maneuver.

Aspect 21. The non-transitory computer-readable medium of Aspect 16 to 20, wherein the one or more scene features include at least one of a road structure, an environmental condition, and a traffic condition.

Aspect 22. The non-transitory computer-readable medium of Aspect 16 to 21, wherein the degree of test coverage is determined based on a number of tests that have the determined similarity exceeding a predetermined level.

Aspect 23. A system comprising means for performing a method according to any of Aspects 11 to 19.

What is claimed is:
1. A system comprising:
a memory; and
one or more processors coupled to the memory, the one or more processors being configured to:
identify a maneuver of an autonomous vehicle (AV);
receive, from a test repository, a plurality of tests that includes the maneuver;

identify one or more segments on a map of an operational design domain (ODD) that include a driving environment for the maneuver;
determine a similarity between a driving scene of each of the plurality of tests and the one or more segments on the map of the ODD; and
determine a degree of test coverage for each of the one or more segments for the maneuver based on the determined similarity.

2. The system of claim 1, wherein determining the similarity comprises:
comparing a first geometry of the driving scene of each of the plurality of tests with a second geometry of the one or more segments identified on the map of the ODD for the maneuver.

3. The system of claim 1, wherein determining the similarity is based on at least one of a road structure, an environmental condition, and a traffic condition.

4. The system of claim 1, wherein the one or more processors are configured to:
in response to determining that the degree of test coverage is below a threshold in a segment of the one or more segments on the map of the ODD, generate a test for the maneuver that emulates the segment on the map of the ODD.

5. The system of claim 4, wherein generating the test comprises:
receiving the test that includes the maneuver from the test repository; and
adjusting one or more scene features in the test to emulate the segment on the map of the ODD for the maneuver.

6. The system of claim 5, wherein the one or more scene features include at least one of a road structure, an environmental condition, and a traffic condition.

7. The system of claim 1, wherein the degree of test coverage is determined based on a number of tests that have the determined similarity exceeding a predetermined level.

8. The system of claim 1, wherein the system comprises the autonomous vehicle.

9. A method comprising:
identifying a maneuver of an autonomous vehicle (AV);
receiving, from a test repository, a plurality of tests that includes the maneuver;
identifying one or more segments on a map of an operational design domain (ODD) that include a driving environment for the maneuver;
determining a similarity between a driving scene of each of the plurality of tests and the one or more segments on the map of the ODD; and
determining a degree of test coverage for each of the one or more segments for the maneuver based on the determined similarity.

10. The method of claim 9, wherein determining the similarity comprises:
comparing a first geometry of the driving scene of each of the plurality of tests with a second geometry of the one or more segments identified on the map of the ODD for the maneuver.

11. The method of claim 9, wherein determining the similarity is based on at least one of a road structure, an environmental condition, and a traffic condition.

12. The method of claim 9, further comprising:
in response to determining that the degree of test coverage is below a threshold in a segment of the one or more segments on the map of the ODD, generating a test for the maneuver that emulates the segment on the map of the ODD.

13. The method of claim 12, wherein generating the test comprises:
receiving the test that includes the maneuver from the test repository; and
adjusting one or more scene features in the test to emulate the segment on the map of the ODD for the maneuver.

14. The method of claim 13, wherein the one or more scene features include at least one of a road structure, an environmental condition, and a traffic condition.

15. The method of claim 9, wherein the degree of test coverage is determined based on a number of tests that have the determined similarity exceeding a predetermined level.

16. A non-transitory computer-readable medium having stored thereon instructions which, when executed by one or more processors, cause the one or more processors to:
identify a maneuver of an autonomous vehicle (AV);
receive, from a test repository, a plurality of tests that includes the maneuver;
identify one or more segments on a map of an operational design domain (ODD) that include a driving environment for the maneuver;
determine a similarity between a driving scene of each of the plurality of tests and the one or more segments on the map of the ODD; and
determine a degree of test coverage for each of the one or more segments for the maneuver based on the determined similarity.

17. The non-transitory computer-readable medium of claim 16, wherein determining the similarity comprises:
comparing a first geometry of the driving scene of each of the plurality of tests with a second geometry of the one or more segments identified on the map of the ODD for the maneuver.

18. The non-transitory computer-readable medium of claim 16, wherein determining the similarity is based on at least one of a road structure, an environmental condition, and a traffic condition.

19. The non-transitory computer-readable medium of claim 16, wherein the one or more processors are configured to:
in response to determining that the degree of test coverage is below a threshold in a segment of the one or more segments on the map of the ODD, generate a test for the maneuver that emulates the segment on the map of the ODD.

20. The non-transitory computer-readable medium of claim 19, wherein generating the test comprises:
receiving the test that includes the maneuver from the test repository; and
adjusting one or more scene features in the test to emulate the segment on the map of the ODD for the maneuver.

* * * * *